(12) United States Patent
Kim et al.

(10) Patent No.: US 8,482,328 B2
(45) Date of Patent: Jul. 9, 2013

(54) SWITCHING DEVICE AND METHOD FOR PREVENTING MALFUNCTION OF THE SAME

(75) Inventors: Tae Hoon Kim, Suwon-si (KR); Tae Won Lee, Suwon-si (KR); Kwang Soo Choi, Seoul (KR); Se Ho Lee, Suwon-si (KR); Doo Young Song, Gwangju (KR); Don Sik Kim, Gunpo-si (KR); Sung Jun Park, Gwangju (KR); Min Ho Heo, Gwangju (KR)

(73) Assignees: Samsung Electro-Mechanics Co., Ltd. (KR); Industry Foundation of Chonnam National University (KR)

( * ) Notice: Subject to any disclaimer, the term of this patent is extended or adjusted under 35 U.S.C. 154(b) by 61 days.

(21) Appl. No.: 13/193,515

(22) Filed: Jul. 28, 2011

(65) Prior Publication Data
US 2012/0161847 A1 Jun. 28, 2012

(30) Foreign Application Priority Data
Dec. 23, 2010 (KR) .................... 10-2010-0133372

(51) Int. Cl.
*H03K 3/017* (2006.01)
*H03K 5/04* (2006.01)
*H03K 7/08* (2006.01)

(52) U.S. Cl.
USPC ........... 327/172; 327/108; 327/109; 327/173; 327/175

(58) Field of Classification Search
USPC ................... 327/172, 173, 175, 108, 109
See application file for complete search history.

(56) References Cited

U.S. PATENT DOCUMENTS
7,190,208 B2    3/2007   Ribarich et al.
2008/0042709 A1*   2/2008   Chen et al. .................. 327/175

FOREIGN PATENT DOCUMENTS
KR    1020100100363 A    9/2010

* cited by examiner

*Primary Examiner* — John Poos
(74) *Attorney, Agent, or Firm* — Blakely Sokoloff Taylor & Zafman

(57) ABSTRACT

The present invention provides a switching device and a method for preventing malfunction of the same. The switching device includes: a controller for outputting a plurality of digital control signals; a protecting unit connected to the controller for protecting all signals when the plurality of digital control signals outputted from the controller are simultaneously received at a state of ON; a gate driver connected to the protecting unit for generating a switch control signal by converting the control signal passed through the protecting unit; and a plurality of switches connected to the gate driver for individually performing ON•OFF operations according to each of the switching control signals.

11 Claims, 4 Drawing Sheets

10

- PRIOR ART -

- PRIOR ART -

100

150

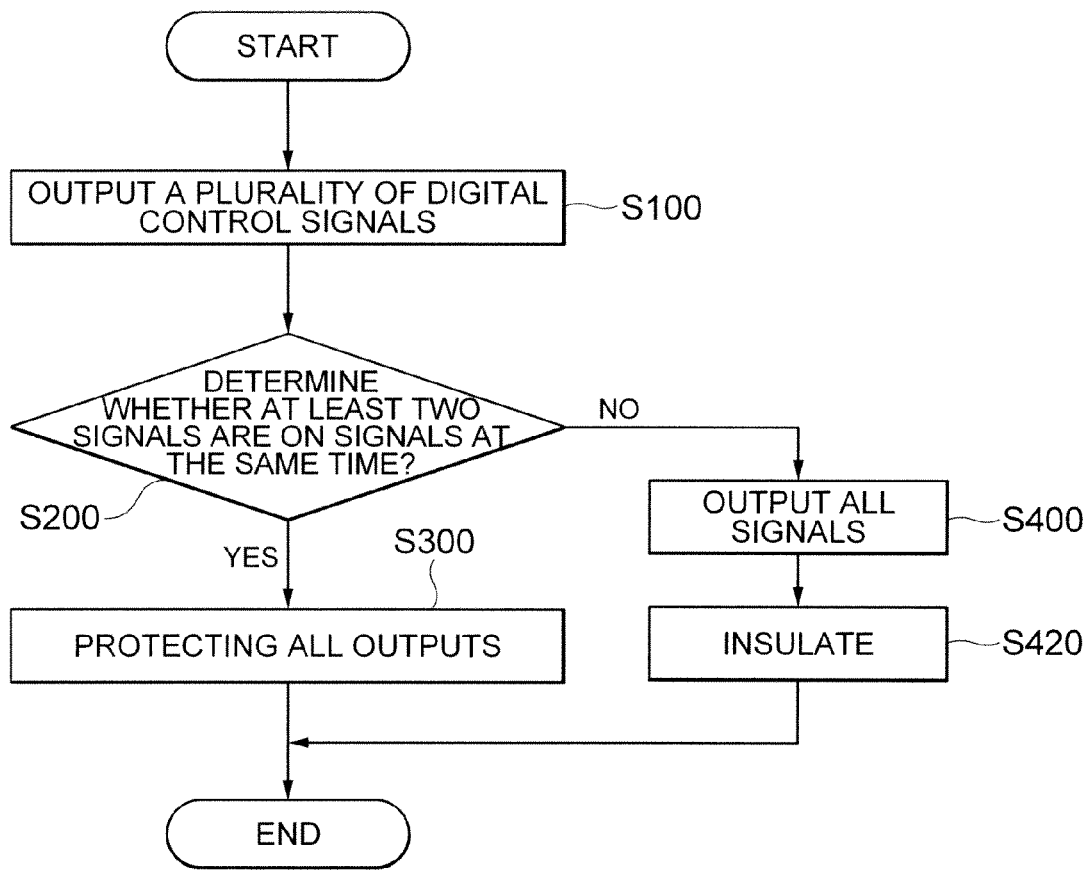

SWITCHING DEVICE AND METHOD FOR PREVENTING MALFUNCTION OF THE SAME

CROSS REFERENCE TO RELATED APPLICATION

This application claims the benefit under 35 U.S.C. Section 119 of Korean Patent Application Serial No. 10-2010-0133372, entitled filed Dec. 23, 2010, which is hereby incorporated by reference in its entirety into this application.

BACKGROUND OF THE INVENTION

1. Field of the Invention

The present invention relates to a switching device and a method for preventing malfunction of the same; and, more particularly, to a switching device capable of preventing a shoot through phenomenon which is generated by becoming a plurality of switches to be ON at the same time, wherein the switches must alternatively become ON, and a method for preventing malfunction of the same.

2. Description of the Related Art

The switching device such as an insulated gate bipolar transistor (IGBT) has been widely used in a lot of field such as a new renewable energy generating inverter, a general purpose inverter and an uninterruptible power supply and or the like.

As viewing a malfunction example of the above switching device, at first, there is an arm short phenomenon that one device is broken in one arm, in this case, the breakdown of the device is induced since a rapid current flows into the switch when a signal is applied to the normal switch.

Thereafter, when the same signals are simultaneously generated at two switched in one switch due to the abnormal phenomenon of the controller or the gate driver, a short current is generated, such phenomenon is called a series arm short.

And then, if the load of the IGBT is short or an output line is erroneously connected, the short can be generated at the output side or a ground short phenomenon can be generated.

FIG. 1 is an exemplary view illustrating a case to generate the series arm short as the second type among the malfunctions of the above switching device, such malfunctions are mainly generated at the time when the malfunction is generated at the controller or the power of the controller is reset.

Due to the above malfunctions, when the rapid current flows, the switch is damaged and the failure of products including the switch may be induced.

FIG. 2 is a conceptual view showing a construction of a conventional switching device, referring to FIG. 2, the PWM_A control signal generated at the controller controls the ON•OFF operations of the switch by applying the PWM_B signal to the control unit of the switch through the gate driver. At this time, when the control signal generated at the controller makes the first switch and the second switch to be ON, the failures of the switching device and products including the switching device can be induced.

SUMMARY OF THE INVENTION

The present invention has been proposed in order to overcome the above-described problems and it is, therefore, an object of the present invention to provide a switching device and a method for preventing malfunction of the same to thereby protect the switching device itself as well as improve the reliability and lifetime of products including the switching device.

In accordance with one aspect of the present invention to achieve the object, there is provided a switching device including: a controller for outputting a plurality of digital control signals; a protecting unit connected to the controller for protecting all signals when the plurality of digital control signals outputted from the controller are simultaneously received at a state of ON; a gate driver connected to the protecting unit for generating a switch control signal by converting the control signal passed through the protecting unit; and a plurality of switches connected to the gate driver for individually performing ON•OFF operations according to each of the switching control signals.

Also, the protecting unit passes all signals when the plurality of digital control signals generated at the controller are not simultaneously received at a state of ON.

At this time, the protecting unit includes: a main signal input terminal for receiving one digital control signal generated at the controller; an auxiliary signal input terminal for receiving another digital control signal except the signal inputted from the main signal input terminal; and an AND gate connected to the main signal input terminal for outputting results values by AND operating a main signal and an inverted auxiliary signal while the auxiliary signal input terminal is inputted by being inverted.

Also, the AND operation outputs the signal values only when a signal among the plurality of digital control signals is equal to the inverted signal thereof and outputs an OFF signal when the signal is not equal to the inverted signal thereof.

Also, the protecting unit further includes a buffer connected to an output terminal of the AND gate.

Also, the gate driver performs a function of converting the digital signals into analog signals.

Also, the gate driver performs a function of electrically insulating the inputted signals and the outputted signals.

Also, the gate drivers are provided in the number of the control signals outputted from the protecting unit to allow each of the gate drivers to receive one signal and output one signal.

In accordance with another aspect of the present invention to achieve the object, there is provided a method for preventing malfunction of a switching device including: (a) outputting a plurality of digital control signals; (b) determining whether at least two digital control signals are ON signals at the same time by receiving the outputted plurality of digital control signals; and (c) protecting outputs when said at least two digital control signals are determined at the same time as the ON signals.

Also, if said at least two digital control signals are not determined at the same time as the ON signals at the step (b), the step (b) further includes: (c1) outputting the inputted all digital control signal as it is.

At this time, a step of converting the digital control signals into analog control signals outputted at the step (c1) can be further included.

Also, a step of outputting by insulating the digital control signals outputted at the step (c1) can be further included.

In accordance with still another aspect of the present invention to achieve the object, there is provided a method for preventing malfunction of a switching device including: outputting a plurality of digital control signals; and AND operating one signal among the outputted plurality of digital control signals outputting and a signal which is inverted from another signal to output the operated signal.

At this time, the AND operation outputs the signal values only when a signal among the plurality of digital control signals is equal to the inverted signal thereof and outputs a switch OFF signal when the signal is not equal to the inverted signal thereof.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 7 is a flowchart showing an operational state in accordance with the embodiment of the present invention.

DETAILED DESCRIPTION OF THE PREFERABLE EMBODIMENTS

Figure 1:
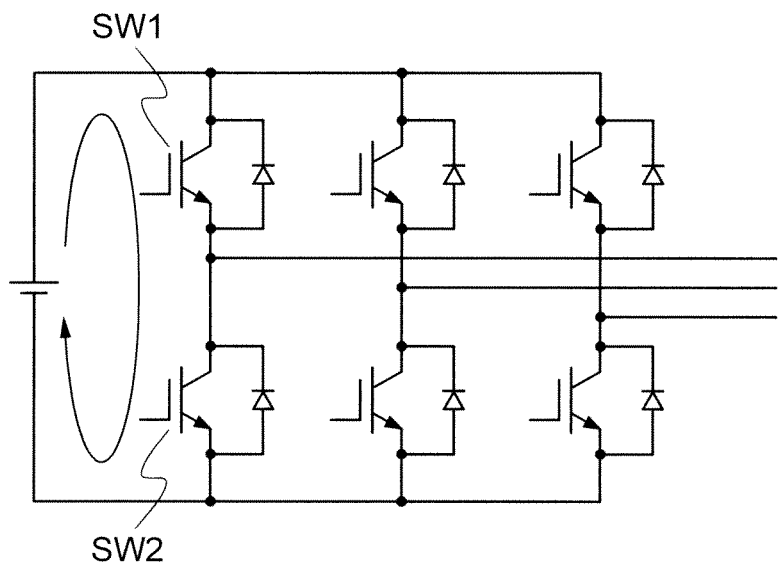
FIG. 1 is an exemplary view illustrating a malfunction example of a switching device.

Hereinafter, embodiments of the present invention will be described in detail with reference to the accompanying drawings. The following embodiments are provided as examples to fully convey the spirit of the invention to those skilled in the art.

Therefore, the present invention should not be construed as limited to the embodiments set forth herein and may be embodied in different forms. And, the size and the thickness of an apparatus may be overdrawn in the drawings for the convenience of explanation. The same components are represented by the same reference numerals hereinafter.

Figure 3:
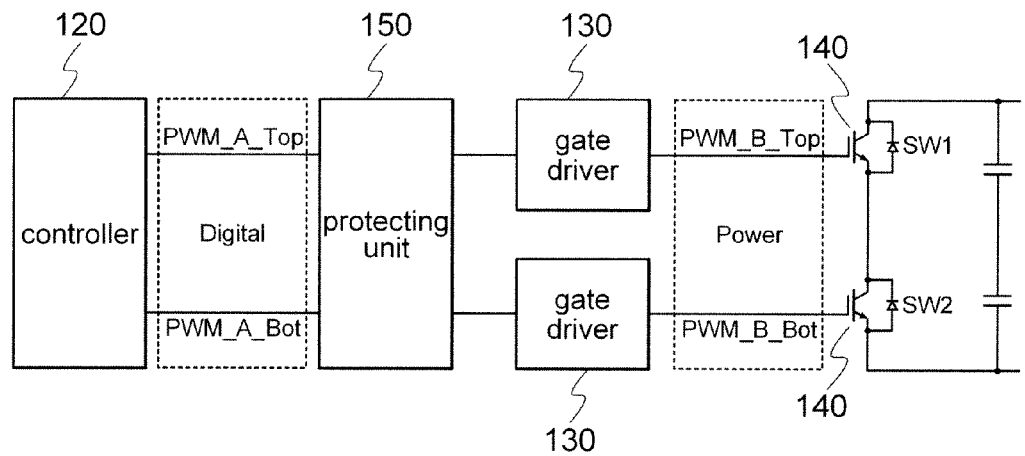
FIG. 3 is a conceptual view representing a construction in accordance with an embodiment of the present invention.

FIG. 3 is a conceptual view representing a construction in accordance with an embodiment of the present invention.

Referring to FIG. 3, a switching device in accordance with the present invention may include a controller 120, a protecting unit 150, a gate driver 130 and a switch 140.

The controller 120 performs a function of generating a control signal for controlling ON•OFF operations of the switch 140. And also, the controller 120 can be performed the ON•OFF operations of the plurality of switches 140 by providing a plurality of output lines, and can be conventionally implemented by a digital signal processing (DSP) of a microprocessor or the like.

The protecting unit 150 connected to the controller 120 can prevent a shoot through phenomenon in advance by preventing a control signal from transmitting to the switch 140 when a switch control signal outputted from the controller 120 allows the switch 140 to be ON at the same time.

The gate driver 130 connected to the protecting unit 150 performs a function of generating the switch control signal by converting the control signal passed through the protecting unit 150.

The switch 140 constituted by a plural number performs individual ON•OFF operations by being connected to the output terminals of the gate driver 130 one by one and controls the output of a power device according to the ON•OFF combination of the gate driver 130.

At this time, the protecting unit 150 performs a protecting operation only when the plurality of digital control signals generated at the controller 120 are received at the state of ON simultaneously, and in the remaining cases, i.e., receives at the state of OFF simultaneously or one is received at the state of ON and the other is received at the state of OFF, the switch control signal is passed as it is to input into the gate driver 130.

In the FIG. 3, two switch control signals are outputted at the controller 120, although there is illustrated only when it is provided with two switches 140, the switches 140 may be more than 3, and the scope of claims is not limited by FIG. 3 and the description of the specification.

More particularly, when more than 3 switch control signals are outputted at the controller 120, if more than 2 switch control signals are outputted in the state of ON, the malfunction of the switch 140 can be prevented by performing the protecting function at the protecting unit 150.

And also, the gate driver 130 performs a function of converting the digital signal into an analog signal, and can perform a function of implementing an electrical insulation between the signal inputted to the gate driver 130 and the signal outputted from the gate driver 130.

Figure 4:
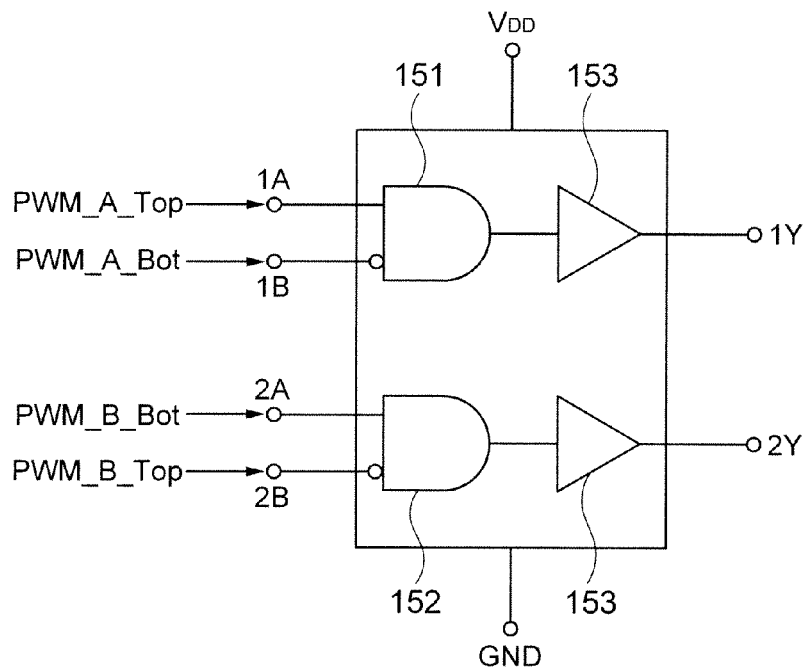
FIG. 4 is a diagram showing a detail construction of a protecting unit in accordance with the embodiment of the present invention.

FIG. 4 is a diagram showing a detail construction of a protecting unit in accordance with the embodiment of the present invention.

Referring to FIG. 4, the protecting unit 150 can be implemented with a circuit to include a plurality of input terminals 1A, 1B, 2A and 2B and AND gates 151 and 152.

The input terminal may roughly include a pair of main signal input terminals 1A and 2A for receiving main signals and a pair of auxiliary signal input terminals 1B and 2B for receiving auxiliary signals.

At this time, the main signals are signals to determine the signals outputted by passing through the AND gates 151 and 152 and the auxiliary signals aid to perform the process for allowing the result values outputted through the AND gates 151 and 152 to be OFF signals (or LOW signals) when the main signals become ON signals (or high signals).

The main signal input terminals 1A and 2A and the auxiliary signal input terminals 1B and 2B are connected to the AND gates 151 and 152, wherein the auxiliary signal input terminals 1B and 2B are connected to the AND gates 151 and 152 through a signal inverter.

The AND gates 151 and 152 perform the roles of outputting the AND operation results of two inputted signals.

The AND operation means that, only when two signals are equal to each other, outputs the signal value thereof, and, when two signals are not equal to each other, outputs a preset reference value, in the switching device in accordance with the present invention, if two signals are not equal to each other, it can be set to output the OFF signal (or the Low signal).

Referring to FIG. 4, if the digital control signals generated at the controller are PWM_A_Top signal and the PWM_A_Bot signal, the PWM_A_Top signal as a main signal for the first AND gate 151 and the PWM_A_Bot as a main signal for the second AND gate 152 are inputted to the main signal input terminals 1A and 2A, respectively, and the PWM_B_Bot signal as an auxiliary signal for the first AND gate 151 and the PWM_B_Top as an auxiliary signal for the second AND gate 152 are inputted to the auxiliary signal input terminals 1B and 2B, respectively.

Herein, in case when the PWM_A_Top signal is a high signal H and the PWM_A_Bot signal is a low signal L, the H is inputted into the 1A and the L is inputted into the 1B which is inverted by the signal inverter to thereby become the H, in this result, if the AND operation is performed at the first AND gate 151, H and H=H, the H signal is outputted to the 1Y.

And also, the L is inputted into the 2A and the H is inputted into the 2B which is inverted by the signal inverter to thereby become the L, in this result, if the AND operation is performed at the second AND gate 152, L and L=L, the L signal is outputted to the 2Y.

Meanwhile, in case when the PWM_A_Top signal is a high signal H and the PWM_A_Bot signal is the high signal H, the H is inputted into the 1A and the H is inputted into the 1B which is inverted by the signal inverter to thereby become the L, in this result, if the AND operation is performed at the first AND gate 151, H and L=L, the L signal is outputted to the 1Y.

And also, the H is inputted into the 2A and the H is inputted into the 2B which is inverted by the signal inverter to thereby become the L, in this result, if the AND operation is performed at the second AND gate 151, L and L=L, the L signal is outputted to the 2Y.

On the other hands, in case when the PWM_A_Top signal is a low signal L and the PWM_A_Bot signal is a high signal H, the L is inputted into the 1A and the H is inputted into the 1B which is inverted by the signal inverter to thereby become the L, in this result, if the AND operation is performed at the first AND gate 151, L and L=L, the L signal is outputted to the 1Y.

And also, the H is inputted into the 2A and the L is inputted into the 2B which is inverted by the signal inverter to thereby become the M, in this result, if the AND operation is performed at the second AND gate 152, H and H=H, the H signal is outputted to the 2Y.

The above-described description is summarized as Table 1.

TABLE 1

| PWM_A_Top | PWM_A_Bot | 1Y | 2Y |
|---|---|---|---|
| H | L | H | L |
| H | H | L | L |
| L | L | L | L |
| L | H | L | H |

Accordingly, in case when the H, H signals to cause a series arm short phenomenon are inputted, since the L, L signals are outputted passing through the protecting unit in accordance with the embodiment of the present invention, the series arm short phenomenon is not generated, and for all cases except this case, since the signal equal to the signal originally inputted to the protecting unit is outputted, the switch can be accurately controlled.

At this time, the buffer 153 can be connected to the output terminals of the AND gates 151 and 152.

Meanwhile, in order to prevent the above-described series arm short phenomenon, the gate driver 130 can be applied to control the top side and bottom side switches of one arm at the same time.

However, since the gate driver to control the plurality of switches simultaneously is internally using a bootstrap or a charge pump method, the application field and target are limited in the aspect of the driving circuit characteristic frequency and the driving capacity (100 W~2 Kw).

That is, in case when the switching device in accordance with the embodiment of the present invention controls a high voltage and a high power or when the differences between the frequency ranges for each channel of the final output signal are large, there occur erroneous operations by performing the output operation by receiving the switch control signals of the plurality of channels by providing only one gate driver 130 as well as the lifetime of the device is also reduced.

Figure 2:
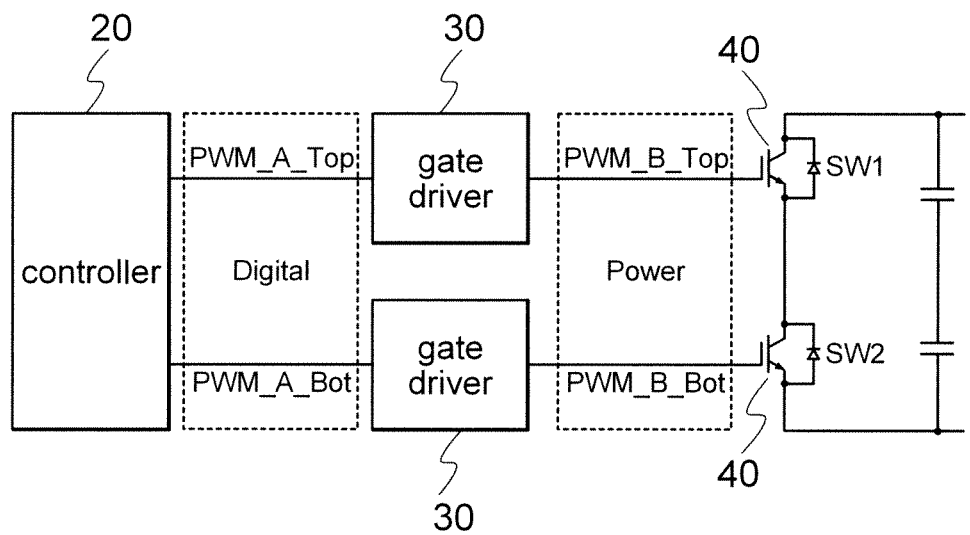
FIG. 2 is a conceptual view showing a construction of a conventional switching device.

And also, a driver using an insulation method by a photo coupler can be applied as a driver to be applied to the large capacity that the application of the above driver is limited or to the switching of low frequency (60 Hz), since such drivers generate one output signal by mostly receiving one input signal, in the system to process the plurality of signals, as shown in FIG. 2, they are operated by being individually connected to each switch. Accordingly, in such case, it is preferable that the gate drivers 130 are provided with the number of the lines outputting the switch control signals outputted from the controller 120 through the protecting unit 150 to receive one signal respectively and to output only one signal.

Figure 5:
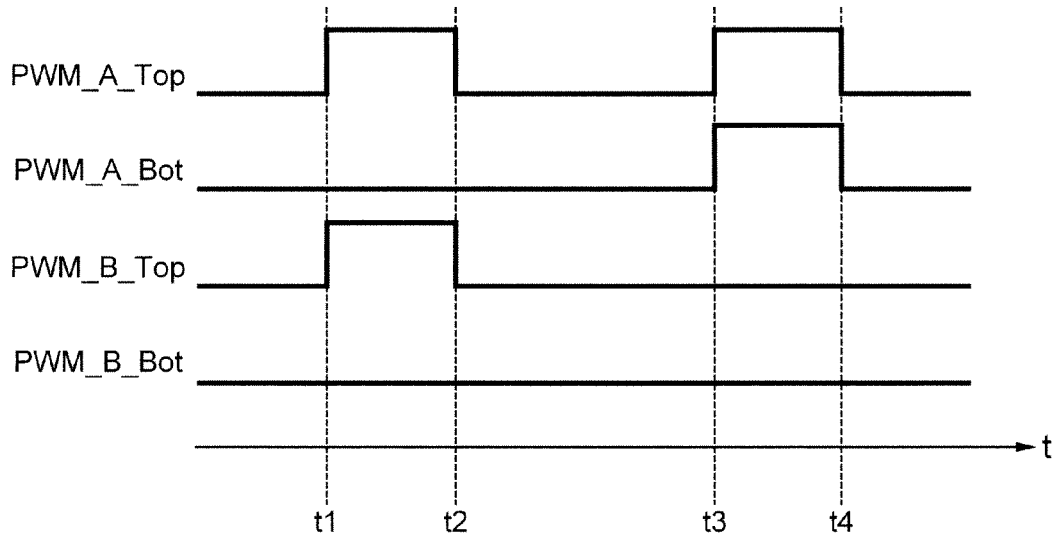
FIG. 5 is a timing diagram showing an operational state due to the construction in accordance with the present invention.

FIG. 5 is a timing diagram showing an operational state due to the construction in accordance with the present invention.

Referring to FIG. 5, since the switch control signal is blocked by the protecting unit 150 at a t3~t4 period when a switch control signal PWM_A_Top to control a first switch 140 (or a top side switch 140) and a switch control signal PWM_A_Bot to control a second switch 140 (or a bottom side switch 140) are ON signals at the same time, it can be confirmed that the first switch 140 and the second switch 140 are prevented from being ON states at the same time by transmitting both of the first switch control signal PWM_B_Top passed through the gate driver 130 and the second control signal PWM_B_Bot to the switch 140 as OFF signals.

Figure 6:
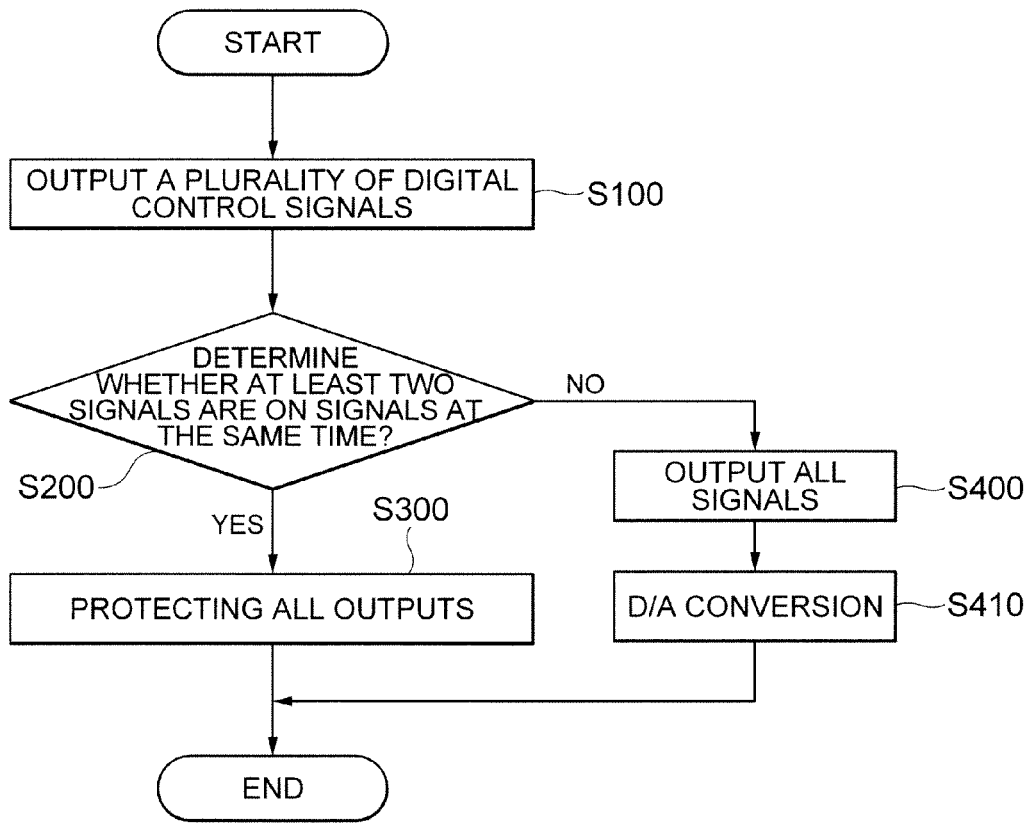
FIG. 6 is a flowchart showing the construction in accordance with the present invention.

FIG. 6 is a flowchart showing the construction in accordance with the present invention.

Referring to FIG. 6, a method for preventing malfunction of a switching device in accordance with the embodiment of the present invention may be constructed to be sequentially proceed (a) outputting a plurality of digital control signals (S100), (b) determining whether at least two digital control signals are ON signals at the same time by receiving the outputted plurality of digital control signals (S200), and (c) protecting outputs when said at least two digital control signals are determined at the same time as the ON signals (S300).

At this time, if said at least two digital control signals are not determined at the same time as the ON signals at the step (b), (c1) the inputted all digital control signal are outputted as it is (S400).

On the other hands, after the step (c1), a step of converting the digital control signals into analog control signals outputted at the step (c1) (S410) may be performed.

And also, as FIG. 7 is a flowchart showing an operational state in accordance with the embodiment of the present invention, referring to FIG. 6, a step of outputting by insulating the digital control signals outputted at the step (c1) (S420).

Although only the constructions in accordance with the embodiments of the present invention are exemplified in FIG. 6 and FIG. 7, the step of converting the digital control signals into analog control signals and the step of insulating the digital control signals may be performed together, and when all ON signals are blocked at the step (b), even when the ON signals are modulated into the OFF signals to output, the step of converting the digital control signals into analog control signals and the step of insulating the digital control signals can be applied.

And also, in accordance with another embodiment of the present invention, it may be constructed by including outputting a plurality of digital control signals and AND operating one signal among the outputted plurality of digital control signals outputting and a signal which is inverted from another signal to output the operated signal.

At this time, the AND operation outputs the signal values only when a signal among the plurality of digital control signals is equal to the inverted signal thereof and outputs a switch OFF signal when the signal is not equal to the inverted signal thereof.

The present invention constructed based on the above description can protect the switching device itself as well as improve the reliability and lifetime of products including the switching device since the malfunction of the switching device is prevented by providing the protecting unit to prevent the switches from being ON simultaneously by the control signals transmitted from the controller.

As described above, although the preferable embodiments of the present invention have been shown and described, it will be appreciated by those skilled in the art that substitutions, modifications and variations may be made in these embodiments without departing from the principles and spirit of the general inventive concept, the scope of which is defined in the appended claims and their equivalents.

What is claimed is:

1. A switching device comprising:
   a controller for outputting a plurality of digital control signals;
   a protecting unit connected to the controller for protecting all signals when the plurality of digital control signals outputted from the controller are simultaneously received at a state of ON;
   a gate driver connected to the protecting unit for generating a switch control signal by converting the control signal passed through the protecting unit; and
   a plurality of switches connected to the gate driver for individually performing ON•OFF operations according to each of the switching control signals,
   wherein the protecting unit passes all signals when the plurality of digital control signals generated at the controller are not simultaneously received at a state of ON.

2. The switching device according to claim 1, wherein the protecting unit comprising:
   a main signal input terminal for receiving one digital control signal generated at the controller;
   an auxiliary signal input terminal for receiving another digital control signal except the signal inputted from the main signal input terminal; and
   an AND gate connected to the main signal input terminal for outputting results values by AND operating a main signal and an inverted auxiliary signal while the auxiliary signal input terminal is inputted by being inverted.

3. The switching device according to claim 2, wherein the AND operation outputs the signal values only when one signal among the plurality of digital control signals is equal to a signal inverted from another signal among thereof and outputs an OFF signal when the signal is not equal to the inverted another one signal thereof.

4. The switching device according to claim 2, wherein the protecting unit further includes a buffer connected to an output terminal of the AND gate.

5. A switching device comprising:
   a controller for outputting a plurality of digital control signals;
   a protecting unit connected to the controller for protecting all signals when the plurality of digital control signals outputted from the controller are simultaneously received at a state of ON;
   a gate driver connected to the protecting unit for generating a switch control signal by converting the control signal passed through the protecting unit; and
   a plurality of switches connected to the gate driver for individually performing ON•OFF operations according to each of the switching control signals,
   wherein the gate driver performs a function of converting the digital signals into analog signals.

6. The switching device according to claim 5, wherein the gate driver performs a function of electrically insulating the inputted signals and the outputted signals.

7. The switching device according to claim 5, wherein the gate drivers are provided in the number of the control signals outputted from the protecting unit to allow each of the gate drivers to receive one signal and output one signal.

8. A method for preventing malfunction of a switching device comprising:
   (a) outputting a plurality of digital control signals;
   (b) determining whether at least two digital control signals are ON signals at the same time by receiving the outputted plurality of digital control signals; and
   (c) protecting outputs when said at least two digital control signals are determined at the same time as the ON signals,
   wherein if said at least two digital control signals are not determined at the same time as the ON signals at the step (b), the step (b) comprising:
   (c1) outputting the inputted all digital control signal as it is.

9. The method for preventing a malfunction of a switching device according to claim 8, further comprising a step of converting the digital control signals into analog control signals outputted at the step (c1).

10. The method for preventing a malfunction of a switching device according to claim 8, further comprising a step of outputting by insulating the digital control signals outputted at the step (c1).

11. A method for preventing malfunction of a switching device comprising:
    outputting a plurality of digital control signals; and
    AND operating one signal among the outputted plurality of digital control signals and a signal which is inverted from another signal among the outputted plurality of digital control signals to output the operated signal,
    wherein the AND operation outputs the signal values only when the one signal is equal to the signal which is inverted from another signal among the outputted plurality of digital control signals and outputs a switch OFF signal when the one signal is not equal to the signal which is inverted from another signal among the outputted plurality of digital control signals.

* * * * *